United States Patent
Olsen et al.

(10) Patent No.: US 6,319,556 B1
(45) Date of Patent: Nov. 20, 2001

(54) REFLECTIVE SURFACE FOR CVD REACTOR WALLS

(75) Inventors: Aage Olsen, Chandler; Michael W. Halpin, Phoenix, both of AZ (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 09/437,069

(22) Filed: Nov. 9, 1999

Related U.S. Application Data

(62) Division of application No. 09/110,541, filed on Jul. 6, 1998, now Pat. No. 6,021,152.
(60) Provisional application No. 60/052,369, filed on Jul. 11, 1997.

(51) Int. Cl.[7] .............................. B05D 3/04; B05D 3/12; C25D 5/34
(52) U.S. Cl. ..................... 427/307; 427/184; 205/206; 205/208
(58) Field of Search .................... 427/307, 299, 427/180, 184; 205/206, 208

(56) References Cited

U.S. PATENT DOCUMENTS

| | | | |
|---|---|---|---|
| 4,106,859 | * 8/1978 | Doriguzzi et al. | 350/338 |
| 4,425,604 | 1/1984 | Imai et al. | 362/223 |
| 4,755,654 | 7/1988 | Crowley et al. | 219/405 |
| 4,789,771 | 12/1988 | Robinson et al. | 219/405 |
| 4,839,522 | 6/1989 | Bourgeois et al. | 250/455.1 |
| 4,863,757 | 9/1989 | Durand | 427/47 |
| 4,912,613 | * 3/1990 | Sanborn | 362/336 |
| 4,975,561 | 12/1990 | Robinson et al. | 219/390 |
| 5,053,247 | 10/1991 | Moore | 427/55 |
| 5,156,820 | 10/1992 | Wong et al. | 422/186.05 |
| 5,243,620 | * 9/1993 | Wisotzki | 372/99 |
| 5,531,835 | 7/1996 | Fodor et al. | 118/728 |
| 5,628,564 | 5/1997 | Nenyei et al. | 374/121 |

FOREIGN PATENT DOCUMENTS 29620783   7/1997   (DE).

* cited by examiner

Primary Examiner—Edna Wong
(74) Attorney, Agent, or Firm—Knobbe, Martens, Olson, & Bear LLP

(57) ABSTRACT

A reflector plate is provided for scattering radiant heat energy in a semiconductor processing reactor chamber to achieve uniform temperature across a substrate to be processed. The surface is characterized by a plurality of adjoining depressions with substantially no planar sections among the depressions. The width to depth ratio for the depressions averages over 3:1. Crests separating the depressions define an angle of greater than about 60°, thus providing a relatively smooth texture for the reflecting surface. The reflecting surface is thus easy to clean. A method of manufacturing the reflector plate comprises removing material from a planar metal surface by ball-end milling. The depth of each depression and degree of overlap with adjacent depressions can randomly vary within selected ranges. A highly specular finish is then provided on the stippled surface by gold electroplating.

20 Claims, 4 Drawing Sheets

REFLECTIVE SURFACE FOR CVD REACTOR WALLS

REFERENCE TO RELATED APPLICATION

The present application is a divisional of U.S. application Ser. No. 09/110,541, filed Jul. 6, 1998, now U.S. Pat. No. 6,021,152, which claims the priority benefit under 35 U.S.C. §119(e) of provisional application No. 60/052,369, filed Jul. 11, 1997.

BACKGROUND OF THE INVENTION

1. Field of the Invention

The present invention generally relates to the manufacture of chemical vapor deposition reactors and, more particularly, to reflective surfaces within such reactors.

2. Description of the Related Art

Chemical vapor deposition (CVD) is a very well known process in the semiconductor industry for forming thin films of materials on wafers. In a CVD process, gaseous molecules of the material to be deposited are supplied to wafers to form a thin film of that material on wafers by chemical reaction. Such formed thin films may be polycrystalline, amorphous or epitaxial. Typically, CVD processes are conducted at elevated temperatures, to accelerate the chemical reaction and produce high quality films.

In the semiconductor industry, it is important that the material be deposited uniformly thick with uniform properties over the wafer. In Very Large and Ultra Large Scale Integrated Circuit (VLSI and ULSI) technologies, the wafer is divided into individual chips having integrated circuits thereon. If a CVD process step produces deposited layers with nonuniformities, devices at different areas on the chips may have inconsistent operation characteristics, or may fail altogether.

One of the most important factors in achieving uniformly thick and high quality thin films is the uniformity of temperature within the chamber, and particularly of the temperature across the semiconductor wafers (or other deposition substrates). Substrates can be heated using resistance heating, induction heating or radiant heating. Among these, radiant heating is the most efficient technique and hence is currently the favored method of supplying energy to a CVD chamber.

Significantly, radiant heating results in short processing times and greater throughput. Radiant heating directly heats the wafer during the CVD process. The temperature of the wafers can be ramped up to the desired process temperature, and ramped down to a satisfactory handling temperature, faster than with alternative heating techniques. Additionally, radiant heating can be controlled to maintain the wafer at the desired temperature for a sufficient time to accomplish the process step. Radiant heating energy can be supplied, for example, by banks of quartz halogen lamps above and below the reaction chamber.

Unfortunately, radiant energy has a tendency to create nonuniform temperature distributions, including "hot spots," due to the use of localized sources and the consequent focusing and interference effects.

In an effort to provide more uniform illumination and resulting uniform temperature distribution across the wafers, the industry practice has been to mount reflectors behind the lamps to indirectly illuminate the wafers. These reflectors are generally made of a base metal and often are gold plated to increase their reflectivity. Planar reflecting surfaces, however, still tend to induce hot spots on wafers being heated.

Accordingly, a need exists for a system for achieving uniform temperature distributions across semiconductor wafers during processing. Desirably, such a system should maintain the advantages of radiant heating.

SUMMARY OF THE INVENTION

The present invention provides a reflecting surface and method of manufacturing the same. The surface has a relatively smooth texture, and yet is sufficiently irregular to scatter radiant heat energy. The reflector thus aids in uniformly heating substrates to be processed while simultaneously presenting an easy-to-clean surface texture. Reactor down time for cleaning is thereby reduced. Additionally, because the reflecting surface can be kept relatively clean, the lifespan of the reflector is lengthened.

In accordance with one aspect of the present invention, a reflector plate is provided for scattering radiant energy in a high temperature reactor. The reflector includes a base plate with a reflecting surface. A plurality of depressions is formed in the reflecting surface. The average ratio of width to depth for the depressions across the reflector plate averages greater than about 3:1. The reflecting surface includes a metallic specular finish conforming to the depressions.

In accordance with another aspect of the invention, a cold wall semiconductor processing reactor is provided. The reactor includes a reaction chamber with at least one window which is transparent to radiant energy. A radiation source is positioned outside of the reaction chamber. A reflector is also positioned outside the chamber, such that the radiation source is interposed between the reflector and the window of the reaction chamber. The reflector has a specular reflecting surface facing the reaction chamber. This reflecting surface includes a plurality of adjoining depressions with substantially no planar surfaces within the depressions.

In accordance with still another aspect of the invention, a method is provided for manufacturing a reflector for scattering radiant energy in a high temperature reactor. A base plate is provided with a substantially planar surface. Material is then removed from the planar surface of the base plate to produce an irregular surface. The irregular surface is provided with a specular finish.

In accordance with still another aspect of the invention, a method of manufacturing a reflector for scattering radiant energy is provided. The method includes providing a base plate with a substantially planar surface. Material is removed from substantially all of planar surface of the base plate to produce a non-planar surface. The non-planar surface is provided with a specular finish.

In accordance with still another aspect of the invention, a method of manufacturing a reflector for scattering radiant energy in a high temperature reactor is provided. A base plate is provided with a substantially planar surface. A plurality of depressions is formed in the base plate. Each of the depressions has a depth into the base plate and a width in a dimension perpendicular to the depth. The ratio of width to depth for the depressions across the reflector plate averages greater than about 3:1. The depressions are provided with a specular finish.

In accordance with still another aspect of the invention, a reflector is provided for scattering radiant energy in a high temperature process reactor. The reflector has a specular reflecting surface which includes a plurality of adjoining depressions. The depressions are arranged with substantially no planar surfaces among or within the depressions.

BRIEF DESCRIPTION OF THE DRAWINGS

These and other aspects of the invention will be apparent from the following description and drawings, which are intended to illustrate and not to limit the invention, and wherein.

DETAILED DESCRIPTION OF THE PREFERRED EMBODIMENT

The preferred embodiment of the present invention is described and illustrated in the context of a single-wafer, chemical vapor deposition furnace. It will be understood, however, in light of the disclosure herein, that the present invention can have application in numerous other contexts in which a uniform distribution of radiant energy is desired.

Figure 1:
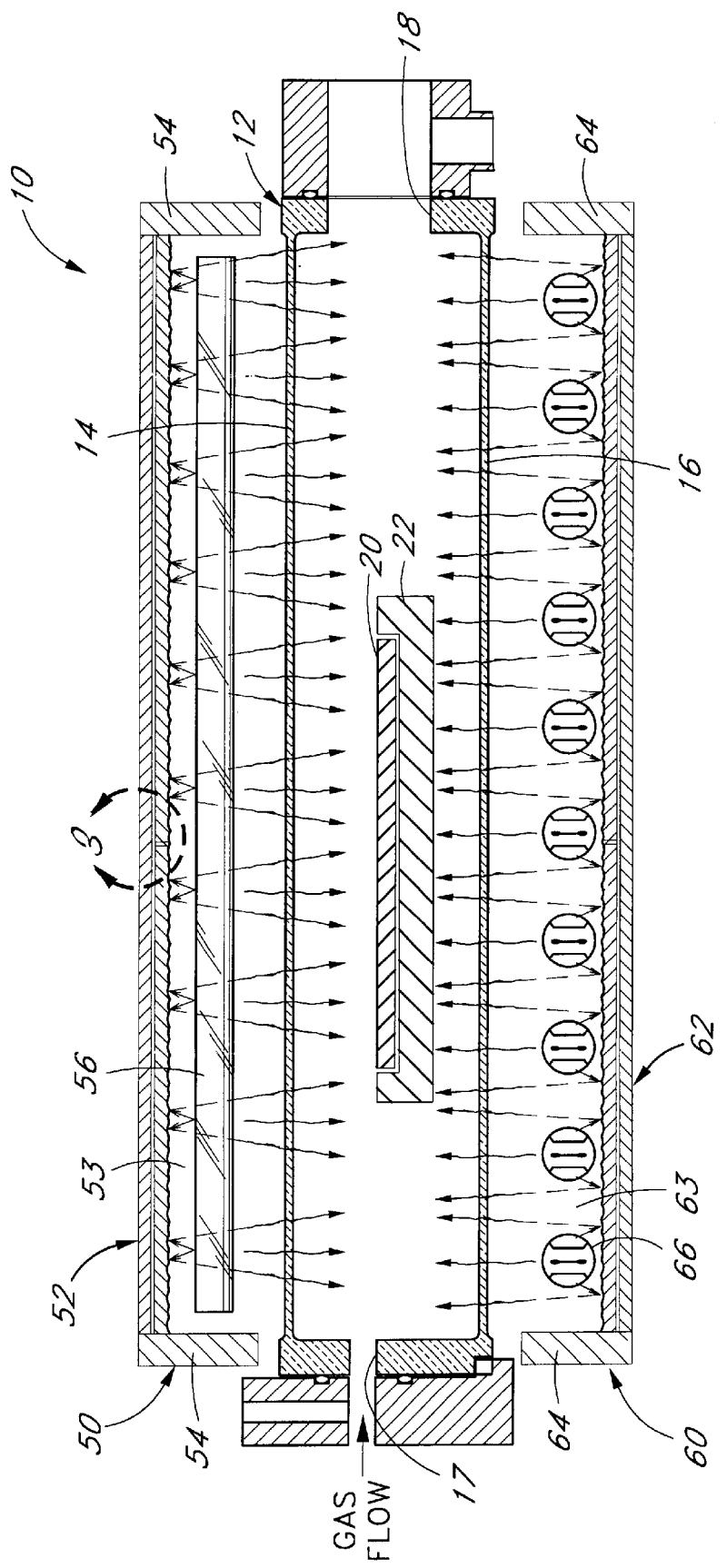
FIG. 1 is a schematic cross-sectional view of a CVD reactor, constructed in accordance with a preferred embodiment of the present invention.

As noted in the "Background" section above, short processing times and consequently greater throughput is of critical importance in the semiconductor industry. The use of radiant heat has thus become prevalent within the industry, to quickly elevate substrate temperatures to the desired processing level. The preferred furnace is accordingly configured for radiant heating of deposition substrates. In the preferred embodiment the heat source emits a full spectrum of light. FIG. 1 illustrates an exemplary chemical vapor deposition (CVD) cold wall furnace 10. The furnace 10 includes a reaction chamber 12 of the horizontal flow type, including at least one window transparent to radiant heat energy, such as fused quartz. The reaction chamber 12 is defined in part by a quartz upper chamber wall 14 and a quartz lower chamber wall 16. Desirably, the chamber walls 14, 16 are flat, although the reaction chamber walls can also be curved for particular structural characteristics. The reaction chamber 12 also includes a gas inlet 17 and an outlet 18, defining a gas flow path therebetween.

The chamber 12 is designed for processing a single substrate 20, such as the illustrated single crystal silicon wafer. It will be understood, however, that the advantages of the preferred embodiment are equally applicable to batch wafer processing furnaces, whether for deposition, etching, anneal, dopant diffusion, photolithographic, or other processes for which elevated temperatures are desired. Additionally, substrates may comprise different materials, such as glass.

The substrate 20 is supported within the chamber 12 in any suitable fashion. For example, the illustrated substrate 20 is supported by a susceptor 22. The susceptor preferably comprises a material opaque to radiant heat energy, such as graphite or silicon carbide, as is known in the art of semiconductor processing equipment. The susceptor and substrate combination are held at a desired height within the reaction chamber 12 by a support structure (not shown), such as a rotatable shaft extending through a tube depending from the bottom wall of the chamber.

The furnace further includes an upper heating chamber 50 and a lower heating chamber 60. The upper heating chamber 50 includes a generally rectangular housing, having a top wall 52, a spaced apart pair of sidewalls 53, and a spaced apart pair of endwalls 54. The floor of the upper heating chamber 50 is defined by the quartz upper wall 14 of the reaction chamber 12. The distance between the upper heating chamber top wall 52 and the substrate 20 is on the order of about 100 mm. For instance, in a standard single-wafer reactor for processing 200 mm wafers, this distance is about 65–70 mm, while a reactor for processing 300 mm wafers has the substrate level spaced about 95–100 mm from the upper heating chamber top wall.

A plurality of radiant heating elements or lamps 56 are mounted within the upper lamp chamber. Desirably, the upper lamps 56 are of an elongated tube type, as shown, disposed in spaced-apart parallel relationship and also substantially parallel with the reactant gas flow path through the underlying reaction chamber 12. Preferably, the lamps are spaced from one another by about 32 mm, from the top wall 52 by about 10 mm, and from the substrate 20 by about 90 mm. It will be understood that each of these dimensions can vary according to heating needs for a particular reactor.

The lower heating chamber 60 is similar in configuration to the upper heating chamber 50, including a bottom wall 62, a spaced apart pair of sidewalls 63, and a spaced apart pair of endwalls 64. The ceiling of the lower heating chamber 60 is formed by the reaction chamber quartz lower wall 16. A plurality of radiant heating elements or lamps 66 are housed within the lower lamp chamber 60. Desirably, however, the lower lamps 66 comprise elongated tubes arranged transverse to the gas flow path, and accordingly transverse to the upper lamps 56. The lower heating chamber 60 can also include separate concentrator lamps (not shown) to compensate for a cold spot created by a cold quartz tube (not shown) rotatably supporting the susceptor 22.

The various lamps 56, 66 are preferably of similar configuration. Each of the elongated tube type heating elements 56, 66 is preferably a high intensity tungsten filament lamp having a transparent quartz envelope containing a halogen gas, such as iodine. The lamps produce radiant heat energy in the form of full-spectrum light, transmitted through the reaction chamber walls 14, 16 without appreciable absorption. As is known in the art of semiconductor processing equipment, the power of the various lamps 56, 66 can be controlled independently or in grouped zones in response to temperature sensors arranged in proximity to the substrate 20.

The lamps 56, 66 are illustrated schematically in FIG. 1, without showing a supporting structure. One of skill in the art, however, will readily recognize a number of manners of mounting the lamps to the heating chamber walls. Preferably, each lamp 56, 66 includes an integrally formed axially extending lug on each of its opposite ends and a suitable connection pin arrangement extends from each of the lugs for receiving connectors provided at the end of electrical conductors. The chamber endwalls include downwardly opening slots through which the lugs extend and shock pads are mounted in the slots above and below the lugs. The lugs and the shock pads are demountably retained in their respective slots by fastener means, such as an offset screw and washer device.

As noted above, reflectors are often utilized in connection with radiant heat lamps, in order to more evenly illuminate and heat wafers in the reaction chamber. Accordingly, the upper heating chamber top wall 52 comprises a highly reflective surface facing the reaction chamber 12, as does the lower heating chamber bottom wall 62. Planar reflecting surfaces, however, still tend to induce hot spots on the wafer. Therefore, the reflective surface should reflect radiant energy in a random or diffuse manner, such as to avoid focusing or interference effects at the substrate 20.

Reflectors behind CVD furnace heating lamps have included roughened or otherwise irregular surfaces in the past. A roughened surface diffuses intense light incident from the lamp filaments, leading to more uniform heating for the wafers. Conventionally, reflecting surfaces have been achieved by surface treating a metal plate by bead-blasting, that is, by impacting the plate with a high velocity stream of glass beads. A pattern of surface roughness is thus achieved mainly by impact, though a small amount of material can be incidentally removed from the surface.

Figure 2:
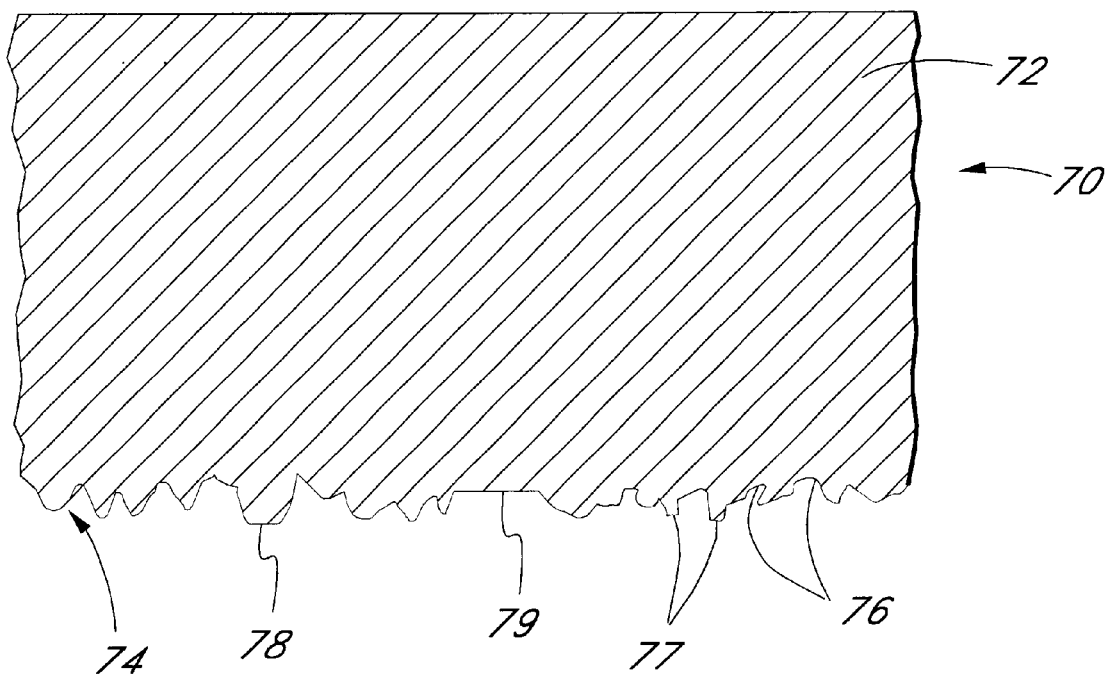
FIG. 2 is a partial cross-sectional view of a bead-blasted reflector plate for a CVD reactor, in accordance with the prior art.

With reference now to FIG. 2, a prior art reflector 70 for mounting behind CVD reactor heating lamps is illustrated. The reflector 70 has been manufactured with a conventional bead-blasting technique. The reflector 70 comprises a metal plate 72 with a diffusely reflective surface 74 formed on the side which is to face the reaction chamber. The surface 74 comprises a number of small recesses or indentations 76 randomly distributed along the surface 74 and separated by sharp edges 77.

The size and distribution of the recesses 76, of course, depends in part upon the size of the glass beads with which the base plate has been bombarded, the density and speed with which they impact the metal plate, and the time of exposure. Typical bead sizes range from about 0.008 to 0.010 inch in diameter. With typical prior art bead-blasting parameters, the depth of the recesses 76 tends to range from 0.0001 to 0.0005 inch. The roughened surface 74 can then be gold-plated for high reflectivity.

Depending upon the length of exposure, the conventional bead-blasting process often leaves untreated areas 78 on the surface 74 among the recesses 76 (i.e., areas that are not deformed by beads). These untreated areas 78 are flat and vary in size. Overexposure to bead-blasting may also result in flattened areas, such as valley 79, as the treatment eventually averages out across the surface. These flat areas 78, 79 tend to cause unwanted local focussing and nonuniform reflections of the lamp filaments, resulting in nonuniform heating over the substrate.

Furthermore, conventional bead-blasting leads to technical difficulties in maintaining the reflector 70. Although a perfectly treated reflector surface may function satisfactorily when clean, the reflective qualities of the rough surface deteriorates over time due to an accumulation of dust or other atmospheric debris, a problem exacerbated by carbonization of the debris from exposure to the high temperature lamps. Build-up of debris disturbs the random reflective characteristics of the rough surface 74 and reduces the amount of heat energy absorbed at the substrate 20. Accordingly, the treated reflective surface 74 must be periodically cleaned.

Conventionally bead-blasted surfaces are very difficult to clean, particularly when mounted in the CVD-reactor. In the first place, conventional bead blasting results in small recesses 76 which are approximately as deep (e.g., 0.0001 inch to 0.0005 inch) as they are wide. Wiping such a surface with a wetted cloth (e.g., deionized water and alcohol) will not reach into the tight confines of such recesses 76, especially where the worker needs to negotiate around delicate lamps just to reach the reflector 70.

Worse yet, fibers from the cleaning cloth tear loose at the sharp edges 77 among the recesses 76 on the rough surface 74, with the fibers getting trapped within the recesses 76. Like other debris, any fiber left within the recesses 76 by the cleaning process tends to become carbonized during high temperature operation. Resultant discoloration in spots of the reflective surface 74 absorbs excessive heat, which can damage the reflector plate and other adjacent parts, reduces the amount of heat that reaches the substrate and destroys the random scattering effect which the rough surface 74 is intended to create.

Stronger cleaning solutions tend to attack gold plating on the reflective surfaces. This deterioration of the gold-plating can also alter the surface reflectivity. More effective cleaning might also be performed by dismantling and removing the reflector from the CVD-reactor. Removal of the reflectors is complicated, however, by the fact that they are typically internally water cooled, and must be extricated from plumbing connections prior to removal.

Deterioration of the rough reflective surface thus tends to continue until the reflector is no longer serviceable and must be replaced. Obviously, this replacement entails greater cost due to the cost of the reflector plate itself, as well as the cost of down time during a complicated dismantling and reflector replacement process. In the semiconductor industry, wafers are continually processed in sequential process steps, such that any reactor down time has a crucial effects on total production efficiency.

Figure 3:
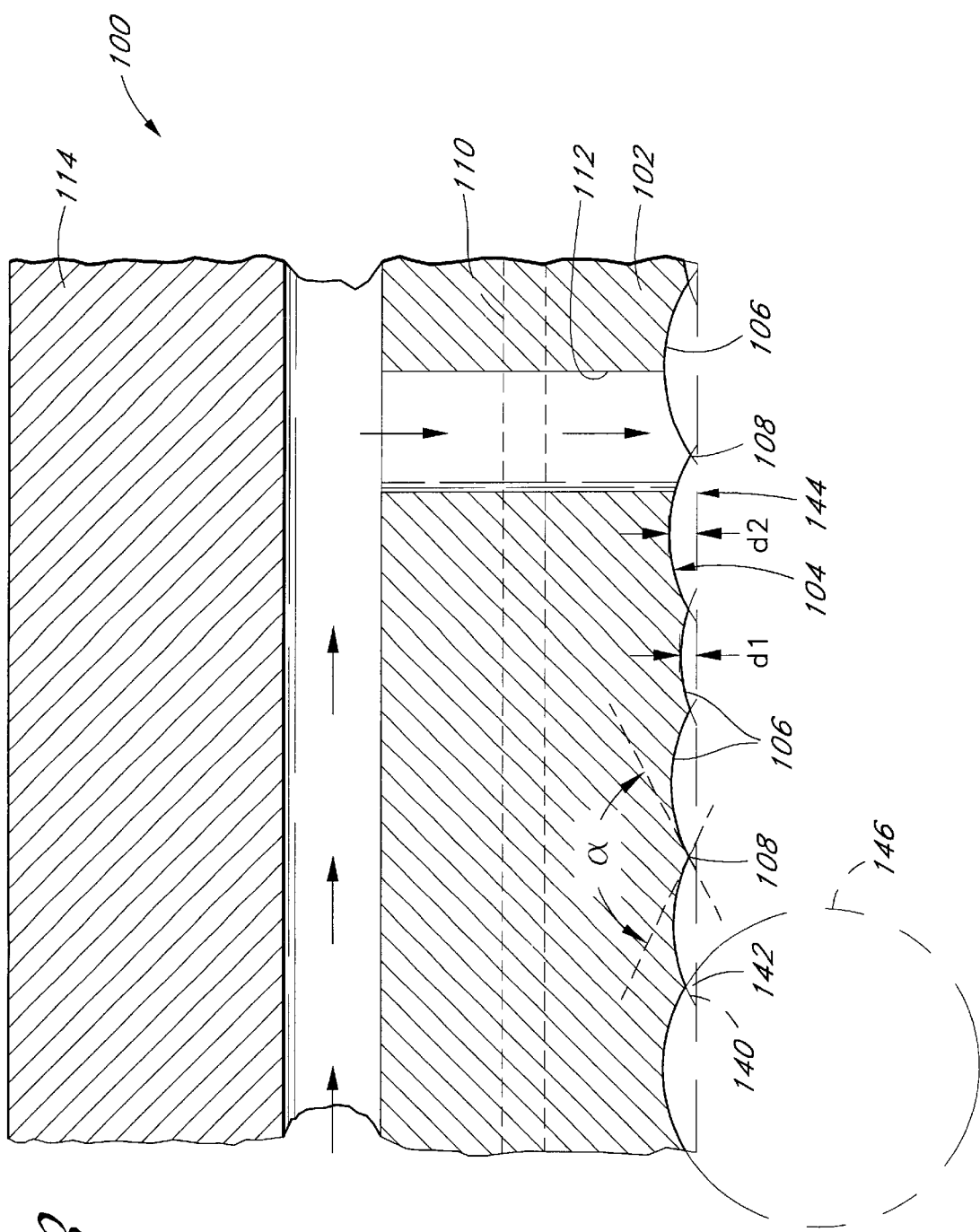
FIG. 3 is an enlarged cross-sectional view of a reflector constructed in accordance with the preferred embodiment.

FIG. 3 is an enlarged sectional view of part of the upper heating chamber top wall 52 illustrated in FIG. 1. The wall 52 includes a reflector 100, constructed in accordance with the present invention. The preferred reflector 100 diffusely reflects or scatters radiant heat from the heating elements 56 to the reactor chamber 12. The reactor 10 thus functions to uniformly heat substrates to be processed.

While the following description focuses on the upper heating chamber top wall 52, it will be understood that the lower heating chamber bottom wall 62 may be identically constructed, though it is mounted in the reactor 10 in an inverted position relative to the top wall. Similarly, other reactor surfaces surrounding the quartz reaction chamber 12 can include similar reflectors such that stray radiant heat is eventually absorbed by the substrate 20 or susceptor 22, rather than by walls outside the reaction chamber 12.

The illustrated reflector comprises a base or primary plate 102, preferably comprising metal and most preferably comprising brass. It will be understood, however, that other metals, such as steel, will also serve satisfactorily for the primary plate 102. The primary plate 102 is thick enough to structurally support its own weight as well as withstand stresses from its intended use. The illustrated plate 102 has a thickness between about ¼ inch and ½ inch, preferably about ⅜ inch. Desirably, the upper heating chamber top wall 52 includes three panels of such primary plates 102 spanning the upper heating chamber 50. It will be understood that longer spans may include thicker reflecting plates for structural reasons. For example, a reactor for processing 300 mm wafers includes reflector plates which are 1 inch in thickness.

The primary plate 102 preferably includes a reflective irregular surface 104. The reflectivity is desirably enhanced by a highly specular metal coating, though it may be provided by a high degree of polishing in other arrangements. Preferably, the coating comprises electroplated gold.

The irregular surface 104 is such as to effectively scatter light upon reflection. In the illustrated embodiment, the irregular surface includes depressions 106 randomly distributed across the surface 104, and may accordingly be referred to as a "stippled"surface. Preferably, the depressions 106 have concave surfaces, though convex surfaces are also possible. The illustrated depressions 106 conform to the surface of a sphere. Desirably, each depression 106 adjoins with another depression 106 at a peak or crest 108, in such a manner that the surface 104 includes substantially no flat plateaus between depressions 106. Substantially no flat surfaces, as used in the present application, indicates that less than about 5% of the stippled surface is planar among the depression, preferably less than about 2%, and most preferably less than about 1%. Furthermore, the surfaces within the depressions 106 themselves comprise substantially no flat or planar surfaces, within the percentages laid out above. It will be understood, however, that the surface 104 can be defined as only the central portion of a plate, such that planar surfaces may be found near the periphery of the plate for ease of mounting the plate within the reactor heating chamber 50.

In the illustrated embodiment, the depth of each depression 106 (relative to its bordering crests 108) preferably ranges from about 0.0005 to 0.020 inch, more preferably from about 0.004 to 0.012 inch. The width of the depressions 106, from peak-to-peak, can range from about 0.002 to 0.300 inch. With the preferred method of manufacture (described below), the width more preferably ranges from about 0.025 to 0.140 inch, and most preferably about 0.090 to 0.105 inch. The ratio of width to depth of the depressions 106 averages greater than about 3:1, preferably greater than about 5:1, and more preferably greater than about 10:1. Most preferably, the ratio is under about 15:1, in order to maintain a random, nonfocusing pattern. The dimensions and relationships among the depressions 106 will be better understood in light of the preferred method of manufacture.

Each crest 108 defines an angle a between tangents to the depression surfaces on either side of the crest 108, as shown. The angle a varies from crest to crest, and also varies along the length of each crest 108. In general, however, the angle α of the crests 108 averages greater than about 60°, and preferably greater than about 90°, due to the shallowness of the low-aspect ratio depressions 106. In the illustrated embodiment, the angle a averages greater than about 110° across a treated plate surface 104.

The illustrated reflector further includes cooling structures to prevent overheating and damage to reactor structures. The preferred reflector 100, for example, desirably is water-cooled. The illustrated reflector 100 includes gun drilled vessels 110 running through the primary plate 102 parallel to the stippled surface 104. These vessels 110, preferably 6 mm in diameter, can be connected to plumbing apparatus in side walls of the reactor. Water is circulated through the vessels 110 during operation to keep the reflector 100 cool.

The illustrated reflector 100 also includes gas ports 112 running through the thickness of the primary plate 102 perpendicular to the stippled surface 104. These ports 112 comprise slots located in proximity to the ends of each elongated lamp 56, where the quartz envelope interfaces with the wires carrying power to the lamps 56. Thus, two such ports 112 are provided for each lamp 56. In the illustrated embodiment, the slots have a width of about 1.5 mm, extending a length of about 50 mm. Cooling air is forced through the gas ports 112 during reactor operation in order to keep the wire interfaces from overheating.

A secondary plate 114 is supported parallel to and adjacent the side of the primary plate 102 opposite the stippled surface 104, preferably spaced about 40 mm from the primary plate 102. While cooling air may flow between the primary plate 102 and the secondary plate 114, the secondary plate 114 serves to reflect any radiant energy which may pass through the gas ports 112. The preferred secondary plate 114 comprises aluminum.

Figure 4:
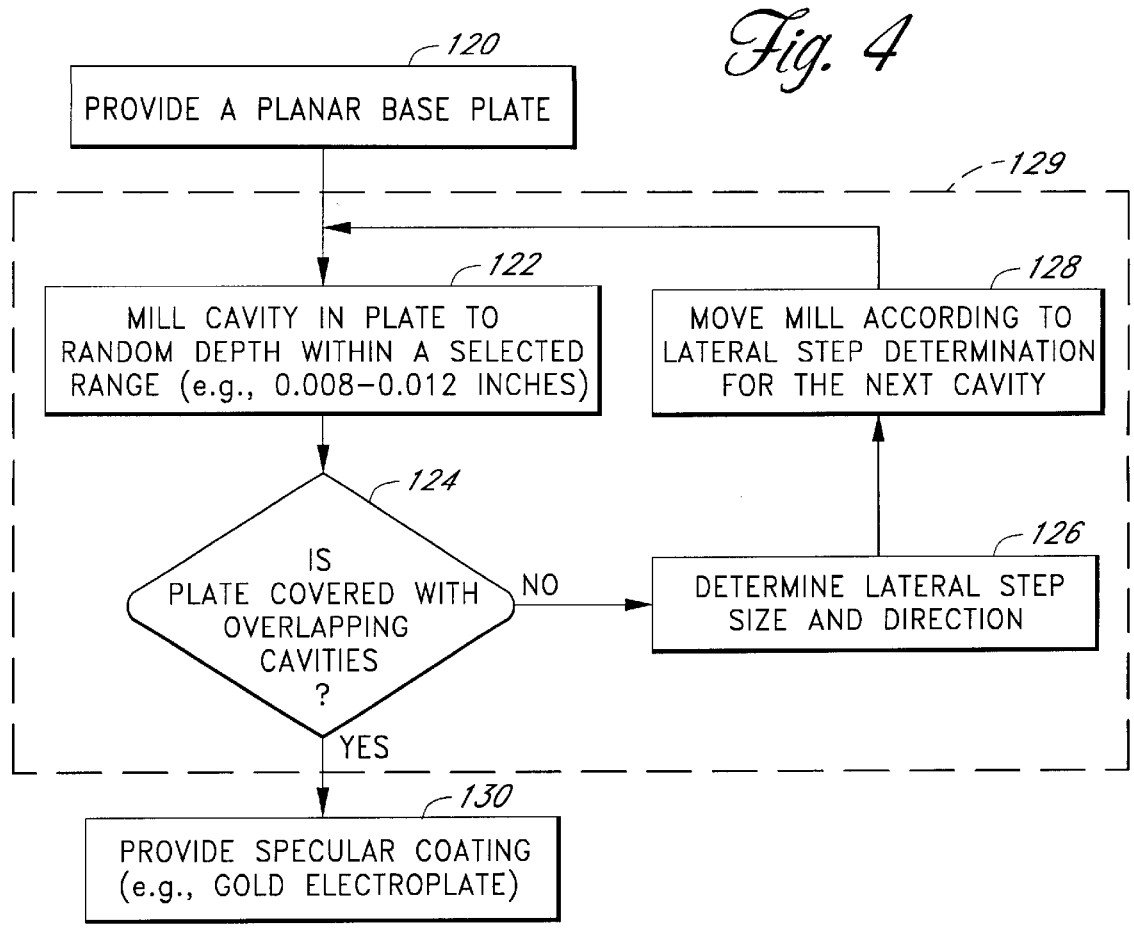
FIG. 4 is a flow chart illustrating a preferred method of manufacturing the reflector illustrated in FIG. 3.

With reference now to FIG. 4, a method of manufacturing the stippled reflector plate 102 is illustrated. While depressions 106 in the primary plate 102 can be formed by any suitable process, the preferred method comprises removal of material from a planar sheet. In the illustrated embodiment, the removal of material is accomplished by ball milling. It will be understood, however, that depressions as described above may also be created by a variety of other known methods, such as by impacting a metal sheet, by molding or by coining a softened sheet with a suitable die.

In the following discussion, the term "cavity" will be used to describe the theoretical shape created by a discrete milling step, without accounting for encroachment by adjacently milled cavities. Cavities produced by a ball-end mill are circular in top down view. The term "depression" is used to describe the structure in the surface 104 (FIG. 3) of the end product, which is partially defined by adjacent depressions. A depression will often deviate from circular when truncated by an adjacent depression. The distinction between cavities and depressions will be better understood by reference to FIG. 5 and accompanying text.

Referring again to FIG. 4, as indicated at step 120, a substantially planar base plate is initially provided 120. The base plate preferably comprises metal, and is brass for the illustrated embodiment. It will be understood that a substantially planar plate may include minor nonplanar imperfections without departing from the spirit of the invention.

Material is removed from the surface of the brass sheet by milling 122, thereby creating a cavity. The milling 122 is automatically controlled by a computer program to remove material up to a random depth within a selected range. The cavity is preferably formed to a depth between about 0.0005 and 0.020 inch, more preferably between about 0.008 and 0.012 inch. The depth of the cavity is measured relative to the original planar surface of the base plate, rather than relative to the resulting peaks.

The milling tool used to create the cavity is preferably a ball-end mill, though other shapes are also possible. The ball-end mill utilized for the removal is desirably 1/16 to 1/2 inch in diameter. A 3/8 inch ball-end mill, commonly available from machine tool suppliers, was used to create the illustrated reflector surface 104. An exemplary milling machine is commercially available under the trade name CNC Mill.

When using the preferred 3/8 inch ball-end mill, milling 122 to a depth of 0.008 to 0.012 inch results in a cavity having a width of about 0.110 to 0.130 inch. The ratio of width to depth is thus greater than 3:1, preferably greater than 5:1, and most preferably between about 10:1 and 15:1. It will also be appreciated that ball-end mills of greater size will produce higher width:depth ratios at the expense of a reduced light scattering effect.

After a cavity has been formed, a decision 124 is made as to whether milling 122 another cavity is required to cover the desired portion of the plate surface with the stippled surface 104 (FIG. 3), such that substantially no flat spots remain. If the base plate has not yet been covered with overlapping or intersecting cavities, the plate will be laterally stepped over 128 and the mill again removes material 122 from the sheet to create another cavity.

Prior to moving the mill (or base plate) for the next cavity, however, a determination 126 is made as to the lateral step size and direction of the step. Such a determination may be made by simply viewing the surface and determining flat spots which require milling. The step size can be randomly selected from a predetermined range of values for which intersecting or overlapping cavities will be formed. Alternatively, step size can be kept constant (e.g., at 0.110 inch, the minimum cavity width created by the preferred ball-end mill and range of cavity depths) while the random depth of the cavities results in the random stipple pattern illustrated in FIG. 3. In either case, the distance between centers of adjacently milled cavities varies randomly within a predetermined range of distances.

Having determined 126 the lateral step, the mill is stepped over in accordance with the determination 126. Another cavity is milled 122 from the base plate, and the process is repeated until the plate surface is covered with intersecting or overlapping cavities, leaving substantially no untreated areas or flat plateaus among the cavities.

In practice, steps 122 to 128 need only be performed once to arrive at a suitable pattern of cavities, and the results of this process programmed to create a reproducible machining step 129. The skilled artisan to calculate or experimentally determine a pattern of lateral steps and depths, in accordance with steps 122 to 128, which will completely treat a patch of the primary plate 102. The ball mill machine can then be programmed to repeatably reproduce the pattern.

The machining step 129, comprising multiple cavity milling steps 122, can consist of a single pattern covering the entire surface which is to diffusely reflect. Alternatively, each machining step 129 can form a patch of overlapping cavities covering less than the entire plate surface. Such patches can then be milled adjacently to mesh with one another and cover substantially the entire primary plate 102 surface with overlapping cavities, resulting in the stippled pattern of FIG. 3.

Figure 5:
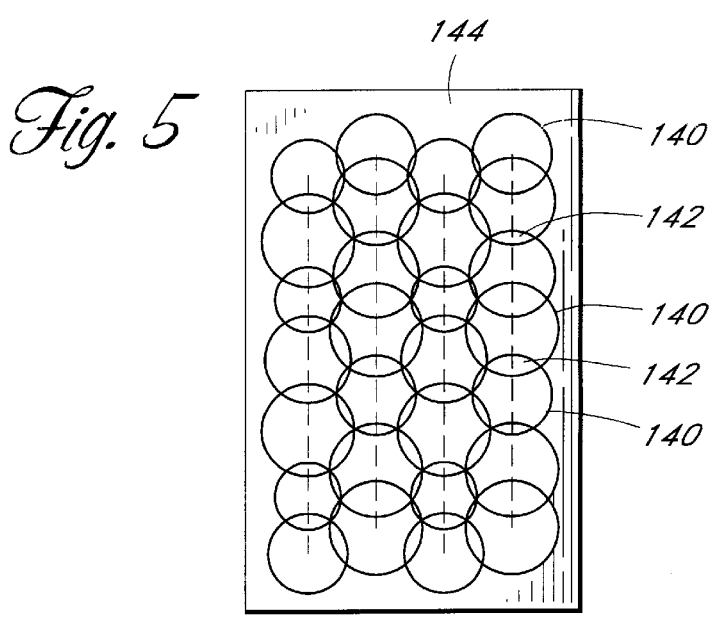
FIG. 5 is a schematic representation of an exemplary arrangement of positions from which to cut cavities in accordance with the preferred embodiment.

FIG. 5 schematically illustrates a surface with an exemplary pattern of positions in which cavities 140 (each circular in top down view for the preferred embodiment) can be milled in accordance with the preferred embodiment. As shown, the cavities 140 include regions of intersection or overlap 142 with one another, leaving no untreated surfaces among the cavities 140. The cavities 140 are illustrated as only partially covering a surface of the primary reflecting plate 102, while a border of the original planar surface 144 remains surrounding the treated area. It will be understood that the amount of untreated border, if any, will depend upon the stippled area required for reflection in the as-mounted configuration.

Referring again to FIG. 4, once the stippled pattern has been produced over substantially all of the plate surface, a highly specular surface is created by coating 130 the stippled base plate. Preferably, a known electroplating process is used for this coating step 130. In the illustrated embodiment, the treated base plate is provided with a nickel flash, followed by a 0.0001 inch gold plating.

Referring again to FIG. 3, the pattern of overlapping cavities 140 results in the adjoining depressions 106. The depressions 106 meet at the crests 108 shown in FIG. 3. As apparent from FIG. 3, showing the original planar surface 144 of the base plate in phantom, each crest 108 occurs within a region of cavity overlap 142. The exact position of the crest 108 (FIG. 3) within the region of overlap 142 depends upon the relative depths of the overlapping cavities 140, as does the angle a of the crests 108.

FIG. 3 also illustrates that the resulting depressions 106 have dimensions slightly smaller than the cavities 140 would if there were no overlap. In the lateral dimension, the depressions 106 are partly defined by the randomly different degrees of overlap 142 from cavities 140 milled on different sides. A degree of encroachment by neighboring cavities 140, thus, produces depressions 106 which are slightly more (e.g., about 10–20% more narrow) than the corresponding cavities 140 milled to produce them.

The depth of the depressions 106 (measured from the average crest 108 level) will also be slightly less than the depth of the milled cavity, which is measured from the original planar surface 144 of the base plate. Due to the overlapping arrangement of the milled cavities 140 (see FIG. 5), substantially all of the original planar surface 144 has been removed by the milling process. Removal of substantially all of the planar surface 144, as utilized herein, indicates that less than about 5% of the original planar surface 144 remains after the milling process is complete. Preferably less than about 2% of the planar surface remains, and most preferably less than about 1%. Accordingly, substantially no flat plateaus remain among the depressions 106. Furthermore, the preferred spherically shaped depressions 106 include substantially no flat or planar surfaces within them. As noted above, these percentages exclude any planar surface in areas which will not reflect radiant energy when mounted in the reactor, including any planar border areas.

While the method of manufacture of the illustrated embodiment comprises removing material from a previously planar surface, it will be understood that equivalent irregular surfaces can be obtained by adding material to a previously planar surface. For example, a plurality of bumps, spherical or otherwise, can be deposited upon a sheet. In this case, the surfaces between peaks of the bumps on the resulting reflecting surface would also form depressions. In contrast to the preferred removal case, the depressions formed by addition of material would generally have convex, rather than concave, surfaces.

Referring again to FIG. 1, in operation, power is delivered to the heating elements 56, which produce radiant heat energy. A portion of the radiant energy passing through the quartz upper chamber wall 14 (without appreciable heat absorption at the wall 14) and falls directly on the substrate 20 or the susceptor 22. A larger portion of the energy, however, reflects from the upper heating chamber top wall 52, which includes the reflector 100 (FIG. 3), and from other reflective surfaces outside the reaction chamber 12. The stippled and highly specular finish of the reflector surface 104 diffusely reflects the radiant energy in a variety of directions. As the reaction chamber 12 is surrounded by reflectors, either planar or treated, reflected radiant energy is ultimately absorbed by the substrate 20 or the susceptor 22.

Due to the scattering of light by the preferred reflector 100, the reflected light travels a random variety of path lengths to reach the substrate 20 and susceptor 22. Accordingly, no hot spots are created at the substrate 20 by interference effects between direct and reflected light. The shape and size of the depressions 106 are also chosen to avoid focusing effects. The deposition substrate 20 is uniformly radiantly heated during CVD or other processing steps.

It will be understood that the stippled reflective surface 104 described with respect to the upper heating chamber top wall 52 will be equally effective for diffusely reflecting radiant energy in the lower heating chamber bottom wall 62. Similarly, in other arrangements, the described reflective surface can be positioned behind heating elements in reactors of a variety of configurations, such that the reflected radiant energy is directed diffusely toward a wafer within a cold wall reaction chamber. Other surfaces surrounding the quartz reaction chamber 12 can also be provided with a stippled reflective surface, as described for the preferred top wall 52.

Also in other arrangements, a heating assembly may include curved focusing reflectors to focus the radiant energy from some heating elements, while the above-described diffusely reflecting surface 104 is positioned behind other heating elements. For example, energy from peripheral heating elements in an upper heating chamber may be focussed downward upon a temperature compensation ring, to compensate for peripheral heat losses at wafer edges, while central heating elements diffusely heat the wafer directly. Separate concentrator lamps can also be provided to focus heat upon supporting structures for the wafer and substrate. U.S. Pat. No. 4,975,561, issued to Robinson, discloses such radiant heat focusing elements.

Furthermore, the stippled surface 104, with more shallow depressions 106, presents a relatively smooth overall texture, without sharp-angled edges which bead-blasting tends to create. A cleaning cloth may reach the bottom of the depressions 106 without snagging on sharp surfaces and leaving fibers behind. The reflector 100 can thus be kept clean of dust and the specular surface 104 free of dark spots which would otherwise tend to create nonuniform reflections. As a result, down time for cleaning the reflector 100 is reduced and the reflector lifespan lengthened.

Although the foregoing description of the preferred embodiment of the present invention has shown, described and pointed out the fundamental novel features of the invention, it will be understood that various omissions, substitutions, and changes in the form of the detail of the apparatus and method as illustrated, as well as the uses thereof, may be made by those skilled in the art, without departing from the spirit of the present invention. Accordingly, the scope of the present invention is not intended to be limited by the foregoing description of the preferred embodiment, but should be defined by reference to the appended claims.

What is claimed is:

1. A method of manufacturing a reflector for scattering radiant energy in a semiconductor processing tool, comprising:

providing a base plate with a substantially planar surface;

removing material from substantially all of the planar surface in a region of the base plate to produce a non-planar surface, wherein removing material comprises milling a plurality of cavities in the planar surface;

providing a reflecting finish on the non-planar surface; and placing the base plate in the semiconductor processing tool.

2. The method of claim 1, wherein removing material from substantially all of the planar surface comprises removing greater than about 98% of the planar surface in the region.

3. The method of claim 2, wherein removing material from substantially all of the planar surface comprises removing greater than about 99% of the planar surface in the region.

4. The method of claim 1, wherein milling the plurality of cavities comprises:

milling a first cavity to a first randomly selected depth within a predetermined range of depths;

moving the base plate relative to a mill by a randomly selected distance within a predetermined range of distances; and milling a second cavity to a second randomly selected depth within the predetermined range of depths.

5. The method of claim 1, wherein the cavities overlap over substantially all of the base plate non-planar surface.

6. The method of claim 1, wherein the cavities have a width to depth ratio greater than about 5:1.

7. The method of claim 1, wherein milling the cavities comprises applying a ball-end mill to the planar surface.

8. The method of claim 7, wherein the ball-end mill has a diameter between about 1/16 inch and 1/2 inch.

9. The method of claim 8, wherein the ball-end mill has a diameter of about 3/8 inch.

10. The method of claim 8, wherein milling the cavities comprises removing material to a depth of between about 0.0005 inch and 0.02 inches.

11. The method of claim 8, wherein milling the cavities comprises removing material to a depth of between about 0.008 inch and 0.012 inch.

12. The method of claim 1, wherein the non-planar surface includes substantially no planar surfaces.

13. The method of claim 1, wherein providing the reflecting finish comprises providing a specular finish on the non-planar surface.

14. The method of claim 1, wherein providing the specular finish comprises nickel flash plating the non-planar surface prior to gold electroplating.

15. A method of manufacturing a reflector plate for scattering radiant energy in a high temperature semiconductor processing reactor, comprising:

providing a base plate with a substantially planar surface;

forming a plurality of depressions in the base plate, each of the depressions having a depth into the base plate and a width in a dimension perpendicular to the depth, a ratio of width to depth for the depressions across the base plate averaging greater than about 3:1;

providing a specular finish on the depressions, to form a reflector plate; and positioning the reflector plate within the high temperature semiconductor processing reactor.

16. The method of claim 15, wherein the ratio of width to depth for the depressions across the base plate averages greater than about 5:1.

17. The method of claim 16, wherein the ratio of width to depth for the depressions across the base plate averages greater than about 10:1.

18. The method of claim 15, wherein forming the plurality of depressions comprises removig material from the planar surface of the base plate.

19. The method of claim 15, wherein forming the plurality of depressions comprises milling a plurality of overlapping cavities.

20. The method of claim 19, wherein milling the plurality of overlapping cavities comprises milling each cavity to a randomly chosen depth within a predetermined range of depths.

* * * * *

UNITED STATES PATENT AND TRADEMARK OFFICE
CERTIFICATE OF CORRECTION

PATENT NO. : 6,319,556 B1
DATED : November 20, 2001
INVENTOR(S) : Olsen et al.

It is certified that error appears in the above-identified patent and that said Letters Patent is hereby corrected as shown below:

<u>Title page,</u>
Item [73], replace the Assignee, ("Micron Technology, Inc., Boise, ID") with -- ASM America, Inc., Phoenix, AZ --.

Signed and Sealed this

Tenth Day of September, 2002

Attest:

JAMES E. ROGAN
Attesting Officer    Director of the United States Patent and Trademark Office